US012764861B2

(12) United States Patent
Li et al.

(10) Patent No.: US 12,764,861 B2
(45) Date of Patent: Oct. 13, 2026

(54) MULTI-CHANNEL MEMORY MODULE

(71) Applicant: Intel Corporation, Santa Clara, CA (US)

(72) Inventors: Xiang Li, Portland, OR (US); Saravanan Sethuraman, Portland, OR (US); George Vergis, Portland, OR (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 17/969,518

(22) Filed: Oct. 19, 2022

(65) Prior Publication Data

US 2023/0044892 A1 Feb. 9, 2023

(51) Int. Cl.

| | |
|---|---|
| ***H05K 1/11*** | (2006.01) |
| ***H05K 1/18*** | (2006.01) |
| ***H10W 90/00*** | (2026.01) |
| *H01R 12/73* | (2011.01) |

(52) U.S. Cl.

CPC ............... *H05K 1/117* (2013.01); *H05K 1/18* (2013.01); *H10W 90/00* (2026.01); *H01R 12/737* (2013.01); *H05K 2201/09172* (2013.01); *H05K 2201/09227* (2013.01); *H05K 2201/09409* (2013.01); *H05K 2201/10159* (2013.01); *H05K 2201/10545* (2013.01)

(58) Field of Classification Search

CPC ................ H01R 12/737; H01R 12/721; H05K 2201/09409; H05K 2201/10159; H05K 2201/10545; H05K 1/117

USPC .......................................................... 439/636

See application file for complete search history.

(56) References Cited

U.S. PATENT DOCUMENTS

| | | | | |
|---|---|---|---|---|
| 6,246,588 B1 * | 6/2001 | Kim | H05K 1/141 | 439/74 |
| 6,461,169 B1 * | 10/2002 | Harrison | H01R 12/7005 | 439/55 |
| 6,830,470 B1 * | 12/2004 | Lynch | H01R 12/721 | 439/636 |
| 7,029,307 B1 * | 4/2006 | Ling | H01R 43/26 | 439/327 |
| 7,366,423 B2 * | 4/2008 | Levy | G02B 6/4274 | 398/164 |

(Continued)

FOREIGN PATENT DOCUMENTS

GB 2383656 A * 7/2003 ............... H05K 1/14

*Primary Examiner* — Marcus E Harcum
(74) *Attorney, Agent, or Firm* — Compass IP Law PC

(57) ABSTRACT

According to examples, a memory module with module rows of conductive contacts can enable multiple memory channels to be connected to the same memory module. In one example, a memory module includes a printed circuit board (PCB) having a first face, a second face, and an edge to be received by a connector. The memory module includes a plurality of memory chips on at least one of the first and second faces of the PCB. The memory module includes two or more rows of conductive contacts on each of the first and second faces of the PCB, the two rows including a first row of conductive contacts proximate to the edge of the PCB to be received by the connector, and a second row of conductive contacts between the first row and a second edge of the PCB opposite to the first edge.

19 Claims, 12 Drawing Sheets

(56) References Cited

U.S. PATENT DOCUMENTS

| | | | | |
|---|---|---|---|---|
| 7,547,213 | B2 * | 6/2009 | Pax | H05K 1/117 174/250 |
| 8,018,753 | B2 * | 9/2011 | Carr | G11C 5/063 365/63 |
| 8,130,560 | B1 * | 3/2012 | Rajan | G11C 8/00 365/63 |
| 9,298,228 | B1 * | 3/2016 | Abhyankar | G06F 1/185 |
| 9,449,650 | B2 * | 9/2016 | Seok | G11C 7/02 |
| 9,818,457 | B1 * | 11/2017 | Querbach | G11C 5/066 |
| 9,929,511 | B2 | 3/2018 | Lynch et al. | |
| 10,109,941 | B1 * | 10/2018 | Li | H01R 13/665 |
| 10,276,219 | B2 * | 4/2019 | Vergis | G11C 5/147 |
| 10,530,077 | B2 * | 1/2020 | Khan | H01R 43/20 |
| 10,667,412 | B2 * | 5/2020 | Lee | H05K 3/341 |
| 10,763,606 | B1 * | 9/2020 | Esmaily | H01R 13/5219 |
| 10,789,010 | B2 * | 9/2020 | Vergis | G06F 3/0656 |
| 10,938,161 | B2 * | 3/2021 | Lee | H01R 13/6595 |
| 11,394,141 | B2 * | 7/2022 | Schnell | H05K 1/141 |
| 12,040,568 | B2 * | 7/2024 | Li | H01R 13/2435 |
| 2003/0048616 | A1 * | 3/2003 | Ko | H05K 1/023 361/736 |
| 2004/0019756 | A1 * | 1/2004 | Perego | G06F 12/0646 711/170 |
| 2004/0192076 | A1 * | 9/2004 | Goodman | H01R 12/7088 439/55 |
| 2004/0205433 | A1 * | 10/2004 | Gower | G11C 5/04 714/E11.041 |
| 2008/0002370 | A1 * | 1/2008 | Lau | G11C 5/04 361/735 |
| 2008/0123305 | A1 * | 5/2008 | Amidi | H05K 1/181 361/737 |
| 2009/0013108 | A1 * | 1/2009 | Rajamani | G11C 11/4093 710/71 |
| 2013/0151745 | A1 * | 6/2013 | Yin | G06F 1/189 710/301 |
| 2014/0160663 | A1 * | 6/2014 | Zhou | G06F 13/382 361/679.32 |
| 2014/0185226 | A1 * | 7/2014 | Lam | H05K 1/141 361/679.31 |
| 2015/0171535 | A1 * | 6/2015 | Li | H01R 12/721 439/78 |
| 2016/0181712 | A1 * | 6/2016 | Wig | H05K 1/117 29/842 |
| 2018/0247678 | A1 * | 8/2018 | Vergis | G11C 5/14 |
| 2019/0237152 | A1 * | 8/2019 | Lee | G11C 29/36 |
| 2020/0083623 | A1 * | 3/2020 | Huang | H05K 1/111 |
| 2020/0119507 | A1 * | 4/2020 | Younger | H01R 43/22 |
| 2020/0226272 | A1 * | 7/2020 | Guim Bernat | G06F 3/0665 |
| 2020/0296822 | A1 * | 9/2020 | Choi | H05K 1/162 |
| 2021/0144840 | A1 * | 5/2021 | Pax | H05K 1/117 |
| 2022/0007508 | A1 * | 1/2022 | Stewart | H05K 1/117 |
| 2022/0046797 | A1 * | 2/2022 | Seok | H05K 1/0248 |
| 2022/0046818 | A1 * | 2/2022 | Placke | H05K 7/1492 |
| 2023/0061451 | A1 * | 3/2023 | Seok | H05K 1/113 |
| 2023/0389207 | A1 * | 11/2023 | Veches | H05K 7/20236 |
| 2024/0032194 | A1 * | 1/2024 | Escamilla | H05K 1/117 |
| 2025/0126714 | A1 * | 4/2025 | Li | H05K 1/117 |

* cited by examiner

MULTI-CHANNEL MEMORY MODULE

FIELD

Descriptions are generally related to computer memory, and more particular descriptions are related to a multi-channel memory module.

BACKGROUND

The performance of computing systems is highly dependent on the performance of their system memory. Computing systems, such as desktop and server computing systems, typically include a motherboard with memory module connectors in which memory modules can be installed to increase system memory capacity. Memory bandwidth is also critical for various computing systems. Typically, memory bandwidth can be increased by adding more memory channels and increasing the memory data rate.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or examples are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

In one example, multi-channel memory modules include multiple rows of conductive contacts to enable connecting multiple channels to the same memory module. Connecting multiple channels to the same memory module can provide advantages in terms of real estate (e.g., area) at the platform level as well as performance in terms of increased bandwidth.

Figure 1A:
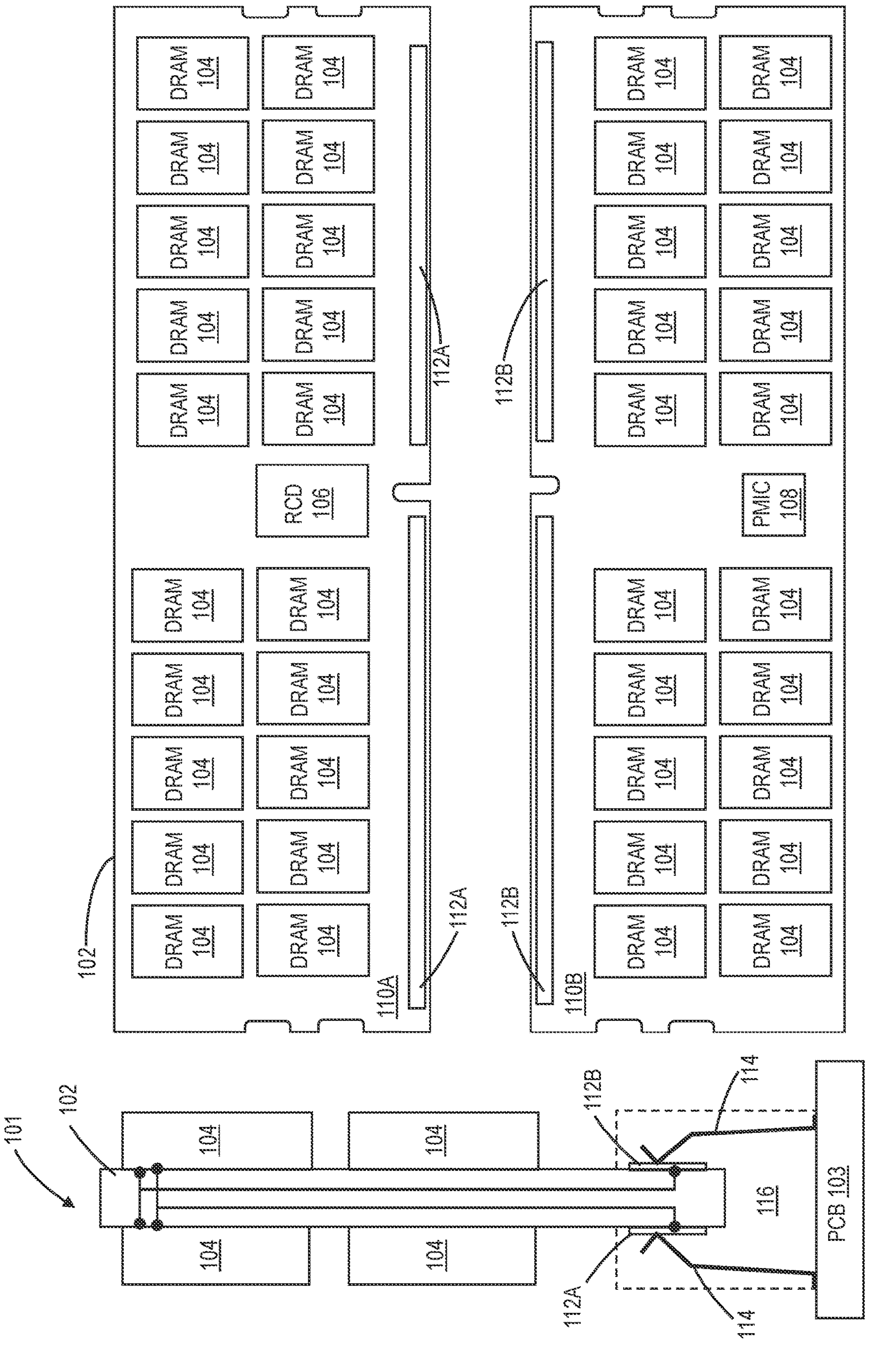
FIG. 1A illustrates a block diagram of an example of a memory module that supports one channel.

FIG. 1A illustrates a block diagram of an example of a memory module that supports one channel. Specifically, FIG. 1A illustrates two faces or sides 110A and 110B of a memory module 102 and a cross-sectional view 101 of the memory module 102 in a connector 116 on a PCB (e.g., a motherboard) 103.

The memory module 102 in FIG. 1A is a dual-inline memory module (DIMM). The DIMM 102 illustrated in FIG. 1A includes DRAM chips on both sides 110A, 110B, a registered or registering clock driver (RCD) 106, and a power management integrated circuit (PMIC) 108. The RCD 106 receives command and clock signals from the memory controller and forwards them to the memory devices in accordance with relevant protocols and standard specifications. In one example, The PMIC 108 includes voltage regulation circuitry and other circuitry to perform power management features.

The DIMM 102 can be inserted or seated into a DIMM connector 116 on the motherboard 103. The connector includes pins 114 that make contact with gold fingers 112A, 112B on the front and back sides 110A, 110B of the DIMM 102. The gold fingers 112A, 112B are coupled with the DRAM chips 104 on the DIMM via conductive traces on or in the DIMM 102. In this way, signals can be transmitted to and from the DRAM chips 104 via the connector 116.

Existing Double Data Rate version 5 (DDR5) DIMMs use a 288-pin connector that supports one channel. For example, the DIMM 102 depicted in FIG. 1A is an example of a single channel dual rank ×4 (2R×4) RDIMM. Increasing the frequency or speed at which the memory channel is operated can increase the bandwidth, but there are limits to the frequency at which traditional RDIMMs can be operated.

Figure 1B:
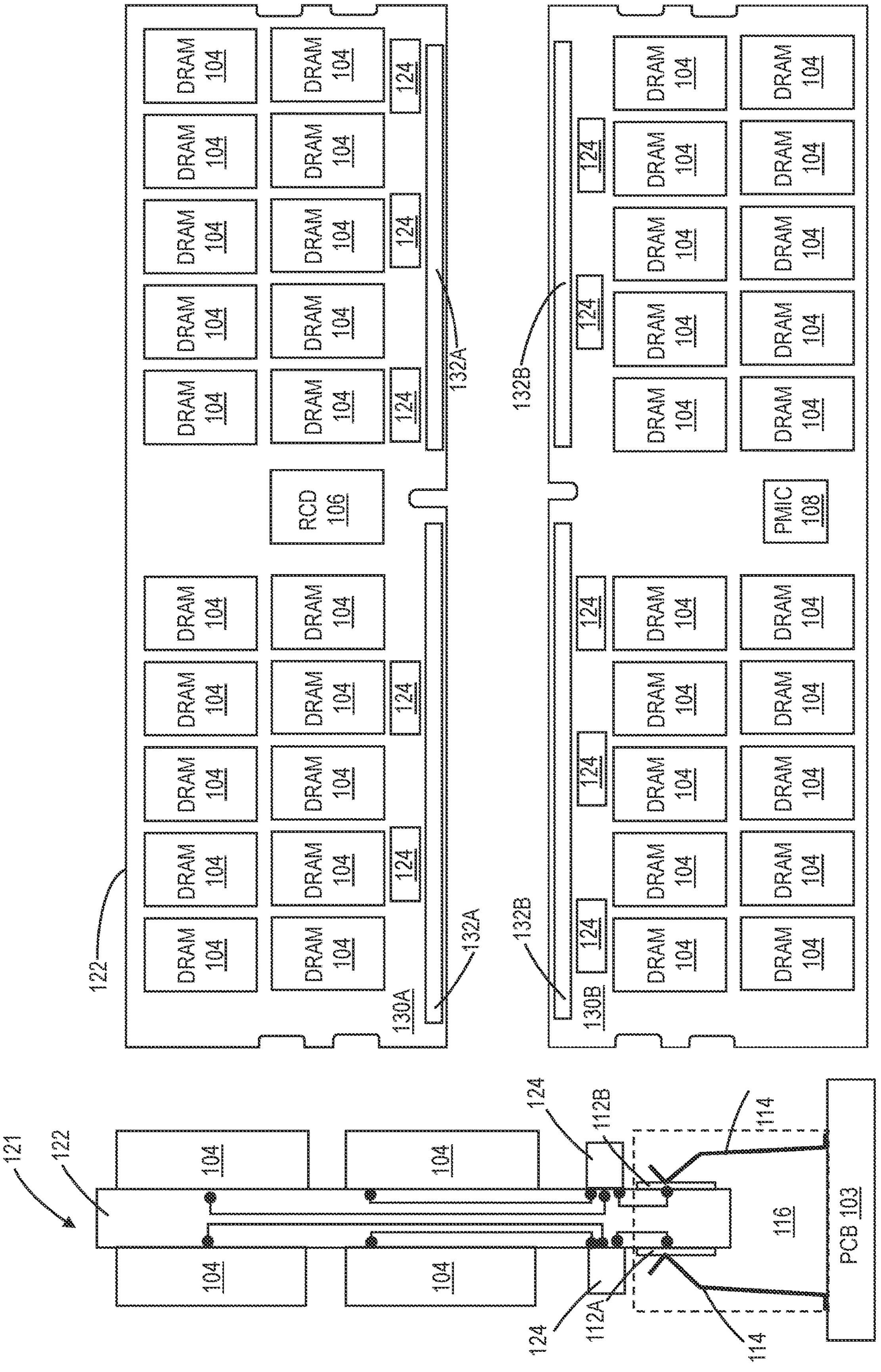
FIG. 1B illustrates a block diagram of another example of a memory module that supports one channel.

FIG. 1B illustrates a block diagram of an example of a memory module that supports one channel. Specifically, FIG. 1B illustrates two faces or sides 130A and 130B of a memory module 122 and a cross-sectional view 121 of the memory module 122 in a connector 116 on a PCB (e.g., a motherboard) 103. Like the DIMM 102 of FIG. 1A, the DIMM 122 illustrated in FIG. 1B includes DRAM chips on both sides 110A, 110B, an RCD 106, and a PMIC 108. Additionally, the DIMM 122 includes data buffers 124. In one example, such as for a load reduced DIMM (LRDIMM), the data buffers 124 store and forward data that is to be passed between the memory channel data bus and the particular rank of the memory chips 104 that is being targeted by an access. The circuitry of the RCD 106 activates whichever rank of memory chips is targeted by a particular access and the data associated with that access is provided by the buffers 124.

In one example, such as for an enhanced load reduced DIMM (eLRDIMM) or a multiplexed rank DIMM (MRDIMM), the DIMM 122 further includes multiplexer circuitry (not shown) between the buffers and the ranks of DRAM chips 104. In one such example, the multiplexer circuitry multiplexes data transfers over a same burst time window to two different ranks of memory chips. Thus, in one such example, every 2-bit signal that the data buffer receives is sent to two different DRAMs (e.g., two of the DRAM chips 104). In one such example, the front end of the data buffers is running at double the data rate relative to the back end of the data buffers. In other words, in one example, the front side data bus (front side DQ) can operate at a higher rate (e.g., double the rate) of the back side data bus (back side DQ), where the front side DQ is between the data buffers 124 of the DIMM 122 and a processor, and the back side DQ is between the data buffers 124 and the DRAM 104. By increasing the front side DQ, the overall memory bandwidth can be increased. However, there are additional costs associated with adding the data buffers 124 and multiplexer circuitry. Additionally, the DIMM 122 is still a one-channel solution. Finally, there are signal integrity challenges to address due to running the front end DQ at a higher data rate.

In contrast, a multi-channel memory module can enable higher bandwidth without the higher costs and challenges associated with adding data buffers and operating the front side DQ at a higher frequency.

Figure 2A:
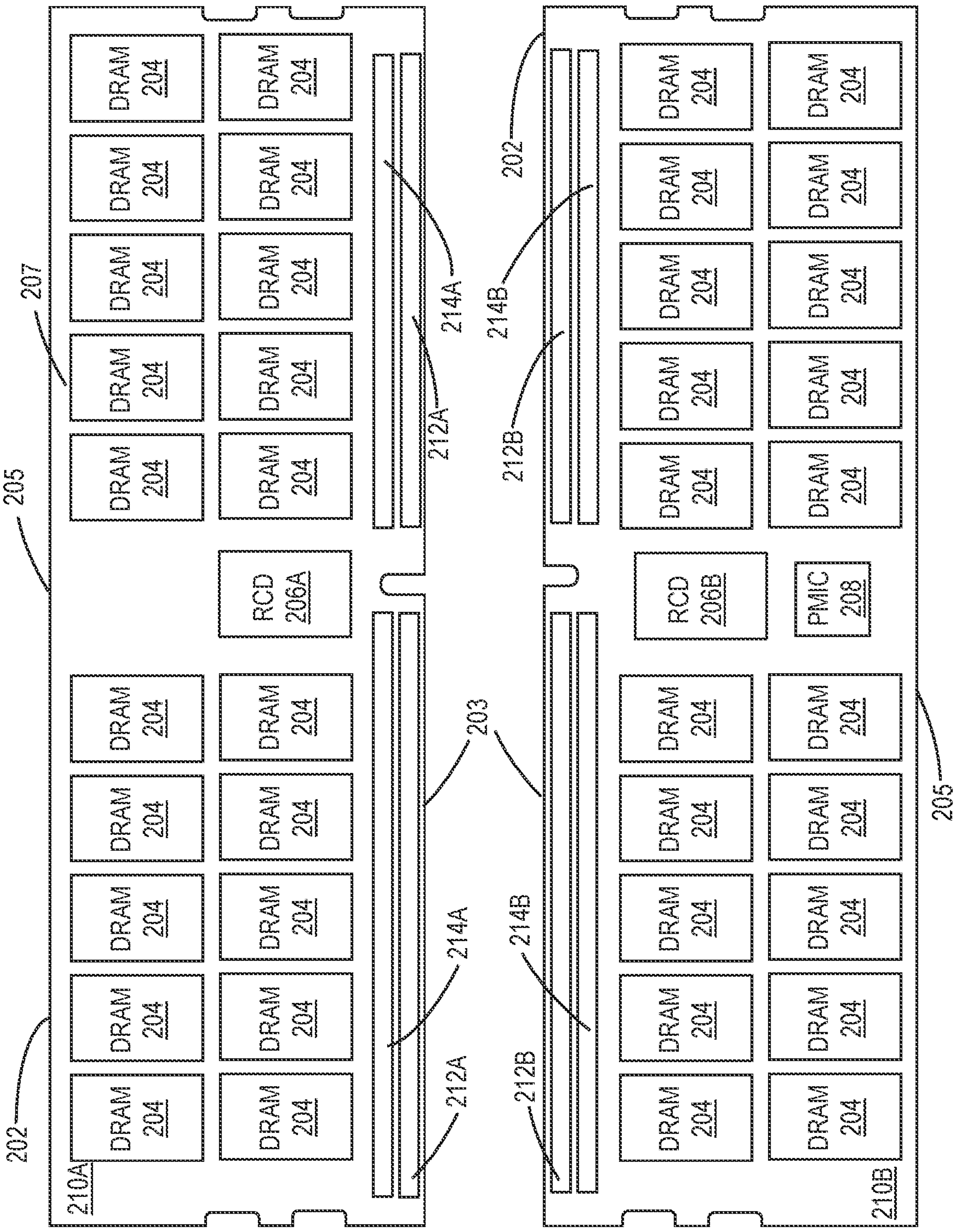
FIG. 2A illustrates a block diagram of an example of a two-channel memory module.
Figure 2B:
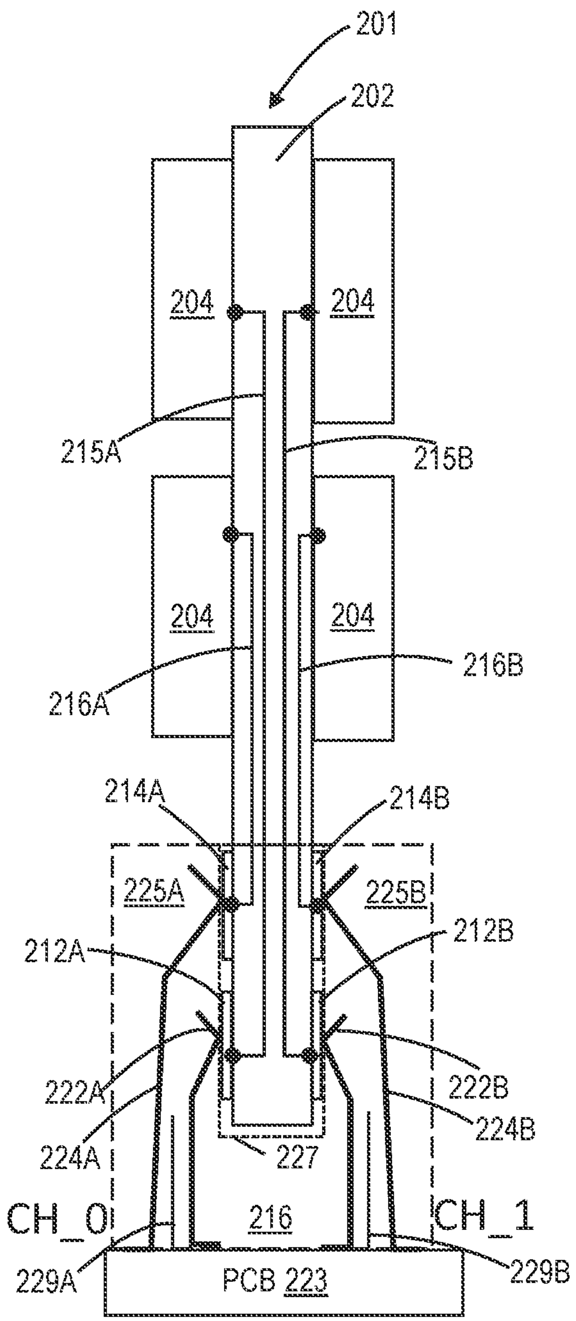
FIG. 2B illustrates a block diagram of an example of a two-channel memory module in a connector.

FIGS. 2A and 2B illustrate a block diagram of an example of a two-channel memory module. Specifically, FIG. 2A illustrates two faces or sides 210A and 210B of a memory module 202, and FIG. 2B illustrates a cross-sectional view 201 of the memory module 202 in a connector 216 on a PCB (e.g., a motherboard) 223. The two faces or sides 210A and 210B of the memory module 202 may be referred to as a "front side" 210A and a "back side" 210B of the memory module 202, or vice versa. The memory module 202 in FIG. 2A is a dual-inline memory module (DIMM). There are a variety of types DIMMs, including unbuffered or unregistered DIMMs (UDIMMs), registered DIMMs (RDIMMs), and load reduced DIMMs (LRDIMMs). In one such example, the DIMM 202 can be inserted or seated into a DIMM connector 216 on the motherboard 223.

In one such example, the DIMM 202 and the DIMM connector 216 are compatible with a memory standard such as a double data rate synchronous dynamic random-access memory (DDR) standard, such as DDR3 (Double Data Rate version 3, original release by JEDEC (Joint Electronic Device Engineering Council) on Jun. 27, 2007), DDR4 (DDR version 4, originally published in September 2012 by JEDEC), DDR5 (DDR version 5, originally published in July 2020), DDR6, LPDDR3 (Low Power DDR version 3, JESD209-3B, August 2013 by JEDEC), LPDDR4 (LPDDR version 4, JESD209-4, originally published by JEDEC in August 2014), LPDDR5 (LPDDR version 5, JESD209-5A, originally published by JEDEC in January 2020), or others or combinations of memory technologies, and technologies based on derivatives or extensions of such specifications.

The memory module 202 illustrated in FIG. 2A includes a printed circuit board (PCB) 207 with two faces or sides 210A, 210B and edges 203 and 205. Note that as used herein, the faces or sides 210A, 210B and edges 203 and 205 may refer to features of the PCB 207 or the memory module 202. Electronic components, including chips, dies, traces, and/or other electronic components are mounted or formed in or on the PCB 207 of the memory module 202. In the example of FIG. 2A, the memory module 202 includes DRAM chips 204 on both sides 210A, 210B of the module, two registered or registering clock drivers (RCDs) 206A and 206B, and a power management integrated circuit (PMIC) 208. The RCDs 206A and 206B receive command and clock signals from a memory controller (e.g., host side memory controller) and forward them to the memory devices in accordance with relevant protocols and standard specifications. For example, the RCDs 206A and 206B may be in compliance with the DDR4 Registering Clock Driver Specification (DDR4RCD02 JESD82-31A), the DDR5 Registering Clock Driver Specification (DDR5RCD02 currently in discussion by JEDEC), or other RCD standards. In one example, The PMIC 208 includes voltage regulation circuitry and other circuitry to perform power management features. In one example, multiple memory channels share the same PMIC 208.

Unlike the memory modules 102 and 122 of FIGS. 1A and 1B, the memory module 202 has a double row of conductive contacts on each side. For example, the memory module 202 includes two rows of conductive contacts aligned over one another on each of the first and second faces 210A, 210B of the memory module 202. For example, the two rows include a first row 212A of conductive contacts on a first face 210A and a first row 212B of conductive contacts on a second face 210B. In the illustrated example, the first row 212A, 212B of conductive contacts on each face is proximate to the edge 203 of the PCB to be received by the connector 216. In one example, the connector 216 is a vertical DIMM connector, or other memory module connector. However, other multi-channel memory modules with the features described herein may be inserted into other types of memory module connectors.

Referring again to FIG. 2A, in the illustrated example, the two rows also include a second row 214A of conductive contacts on the first face 210A and a second row 214B of conductive contacts on the second face 210B. In the illustrated example, the second row of conductive contacts on a face of the memory module 202 is between the first row of conductive contacts on that face and a second edge 205 of the memory module opposite to the first edge 203. For example, referring to the first face 210A, the second row 214A is between the first row 212A and the edge 205. Similarly, the second row 214B is between the first row 212B and the edge 205. In the illustrated example, the second row is also between the first row and the plurality of memory chips 204. For example, referring to the first face 210A, the second row 214A is between the first row 212A and the memory chips 204 on the face 210A. Similarly, the second row 214B is between the first row 212B and the memory chips 204 on the face 210B.

The connector 216 includes pins 222A, 222B, 224A, and 224B that make contact with conductive contacts in rows 212A, 212B, 214A, and 214B, respectively, on the front and back sides 210A, 210B of the memory module 202. The conductive contacts in the rows 212A, 212B, 214A, and 214B are coupled with the DRAM chips 204 on the memory module 202 via conductive traces 215A, 215B, 216A, and 216B on or in the memory module 202. In this way, signals can be transmitted to and from the DRAM chips 204 via the connector 216.

For example, the two rows 212A, 212B and 214A, 214B on each face of the memory module 202 are to couple with two rows of corresponding pins in each side 225A, 225B of the memory module connector 216. Thus, unlike the connector 116 illustrated in FIGS. 1A and 1B, the connector 216 of FIG. 2B has two sets or rows of pins 222A, 222B and 224A, 224B on each side 225A, 225B of a slot 227 of the connector 216 to receive the memory module 202. In one example, the connector 216 includes inner pins 222A, 222B and outer pins 224A, 224B. In one example, the two sets of inner pins 222A, 222B are nested inside or otherwise disposed in between two sets of outer pins 224A, 224B. In the illustrated example, the inner pins 222A, 222B are shorter in length than the outer pins 224A, 224B to enable the inner pins 222A, 222B to contact one row 212A, 212B of conductive contacts on the memory module 202 while the outer pins 224A, 224B contact a second row 214A, 214B of conductive contacts on the memory module 202.

Thus, in the illustrated example, the first row 212A of conductive contacts on one face 210A of the memory module 202 are to couple with a plurality of inner pins 222A on one side 225A of the connector 216, and the first row 212B of conductive contacts on the other face 210B of the memory module 202 are to couple with the plurality of inner pins 222B on the other side 225B of the connector 216. Similarly, the second row 214A of conductive contacts on one face 210A of the memory module 202 are to couple with a plurality of outer pins 224A on one side 225A of the connector 216, and the second row 214B of conductive contacts on the other face 210B of the memory module 202 are to couple with a plurality of outer pins 224B on the other side 225B of the connector 216.

In one example, the two rows of conductive contacts on each of the first and second sides of the memory module are to couple with two memory channels. For example, the memory module 202 of FIG. 2A supports a first memory channel (e.g., CH_0) with the first and second rows 212A, 214A of conductive contacts on one face 210A of the memory module 202, and a second memory channel (e.g., CH_1) with the first and second rows 212B, 214B of conductive contacts on the other face 210B of the memory module 202. Thus, in this example, the first and second rows 212A, 214A (e.g., bottom and top rows) of conductive contacts on the first side 210A of the memory module 202 are to couple with a first memory channel, and the first and second rows 212B, 214B (e.g., bottom and top rows) of conductive contacts on the second side 210B are to couple with a second memory channel. In one such example, the DRAM chips 204 on the first side 210A provide memory resources for the first memory channel, and the DRAM chips 204 on the second side 210B provide memory resources for the second memory channel. Also, in the example of FIG. 2B, the two rows of connector pins 222A and 224A on one side 225A of the connector 216 couple with one memory channel (CH_0) and the two rows of connector pins 222B and 224B on the other side 225B of the connector 216 couple with a second memory channel (CH_1).

Thus, the example in FIGS. 2A and 2B illustrate one side 210A (e.g., the front side) as channel 0 and the other side 210B (e.g., the back side) as channel 1. A ground plane between the sides 225A and 225B of the connector 216 and in the PCB 207 of the memory module 202 can fully shield the channel-to-channel crosstalk. For example, the connector 216 includes a first ground plane 229A between the pins 222A and 224A, and a second ground plane 229B between the pins 222B and 224B.

Figure 2C:
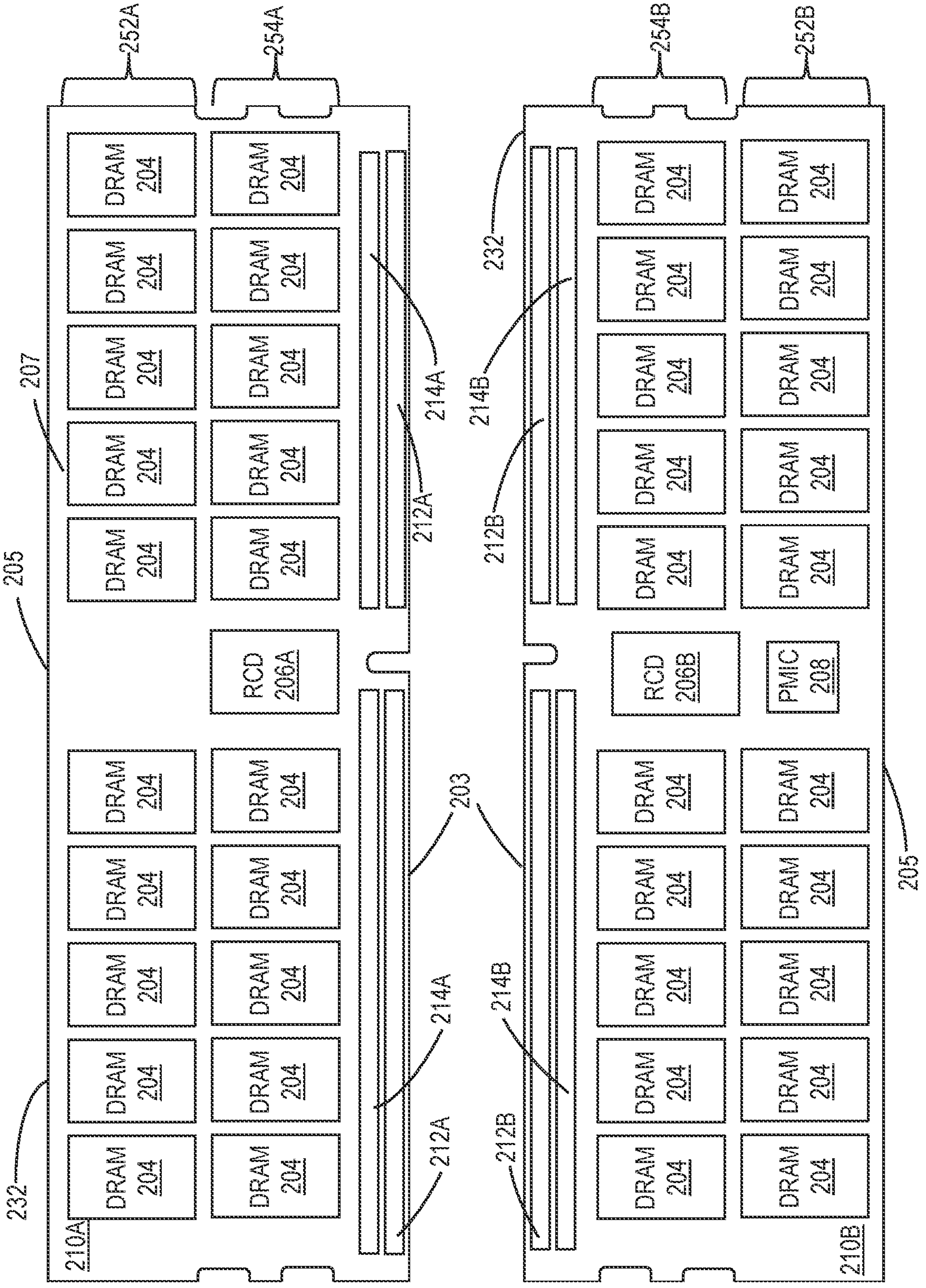
FIG. 2C illustrates a block diagram of an example of a two-channel memory module.
Figure 2D:
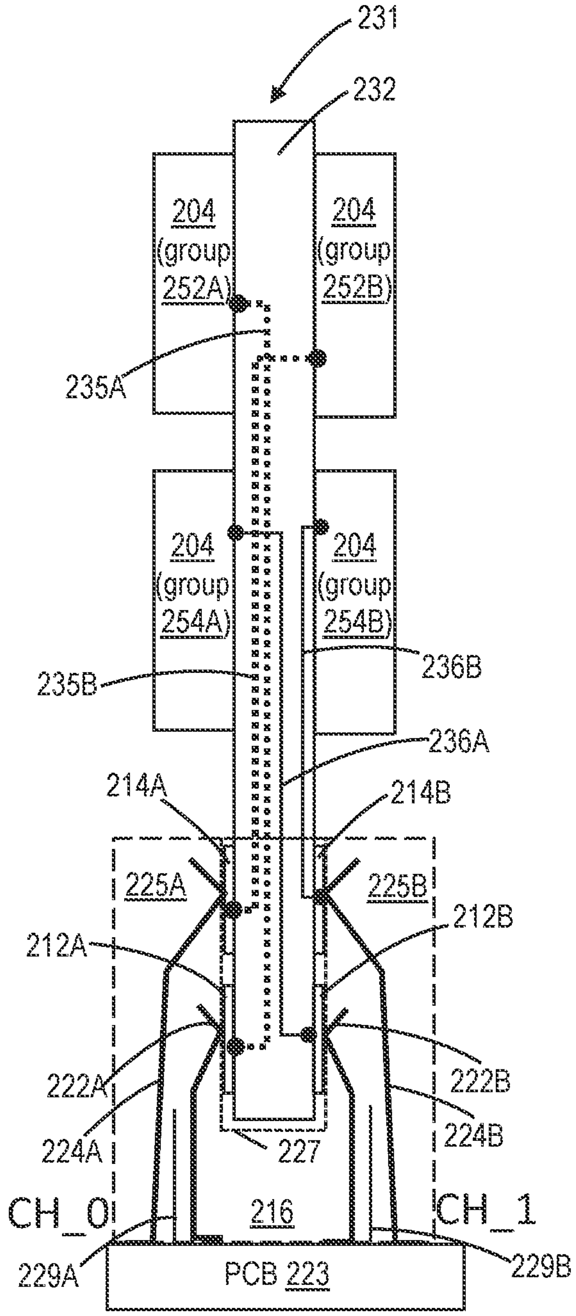
FIG. 2D illustrates a block diagram of an example of a two-channel memory module in a connector.

FIG. 2C and FIG. 2D illustrate another example of a two-channel memory module in which one row DRAM chips on a face of the memory module can be used for one channel the other row of DRAM chips can be used for the second channel. Specifically, FIG. 2C illustrates two faces or sides 210A and 210B of a memory module 232, and FIG. 2D illustrates a cross-sectional view 231 of the memory module 232 in a connector 216 on a PCB (e.g., a motherboard) 223. Like the memory module 202 of FIG. 2A, the memory module 232 of FIG. 2C includes a double row of conductive contacts on each side, for a total of four rows of conductive contacts.

However, unlike the example in FIG. 2A in which each side of the memory module supports a different memory channel, the routing and layout of the memory module 232 of FIG. 2C is organized such that one group of DRAM chips 204 on a side of the memory module provides memory resources for one memory channel, and a second group of DRAM chips 204 on the same side provides memory resources for a second memory channel. For example, the group 252A of DRAM chips 204 on the first side 210A of the memory module 232 is coupled with a first memory channel (e.g., CH_0) and the group 254A of DRAM chips 204 is coupled with a second memory channel (e.g., CH_1). Similarly, the group 252B of DRAM chips 204 on the second side 210B of the memory module 232 is coupled with the first memory channel (e.g., CH_0) and the group 254B of DRAM chips 204 is coupled with the second memory channel (e.g., CH_1).

In the illustrated example, to support this configuration, the memory module 232 includes traces 235A to couple the conductive contacts in the row 212A with DRAM chips in the group 252A, traces 236A to couple the conductive contacts in row 212B with the DRAM chips 204 in the group 254A, traces 235B to couple the row 214A of conductive contacts with the DRAM chips 204 in the group 252B, and traces 236B to couple the conductive contacts in row 214B with the DRAM chips in the group 254B. Thus, in the illustrated example in FIG. 2C, at least some of the conductive contacts on one side of the memory module 232 are coupled with DRAM chips on the other side of the memory module 232. However, like in the example in FIGS. 2A and 2B, the pins on one side of the connector 216 couple with the first channel, and the pins on the other side of the connector couple with the second channel. Similarly, the double row 212A, 214A of contacts on the first side 210A of the DIMM couples with the first channel, and the double row 212B, 214B of contacts on the second side 210B of the DIMM couples with the second channel. Note that although the example of FIG. 2C shows the groupings of DRAM chips in rows, other configurations of DRAM chips are possible.

Thus, the memory modules 202 of FIG. 2A and 232 of FIG. 2C include a double row of conductive contacts on each side (for four rows of contacts total) to enable doubling the pin count relative to conventional DIMMs and to enable two memory channels on a single memory module. Thus, the two-channel memory module can enable doubling the bandwidth relative to conventional DIMMs. However, in one example, a conventional one-channel DIMM can be plugged into the connector 216 to achieve half the bandwidth of the 2-channel memory modules 202 and 232 (e.g., for backwards compatibility). In one such example, only the inner pins 222A, 222B of the connector would be used for the single-channel DIMM.

Although FIGS. 2A-2D illustrate memory modules with double rows of contacts on each side to support two channels, multi-channel memory modules may include more than two rows of contacts to support more than two channels. For example, FIG. 2E illustrates a block diagram of an example of a three-channel memory module, and FIG. 2F illustrates a block diagram of a view 251 of a three-channel memory module 252 in a connector 256.

Figure 2E:
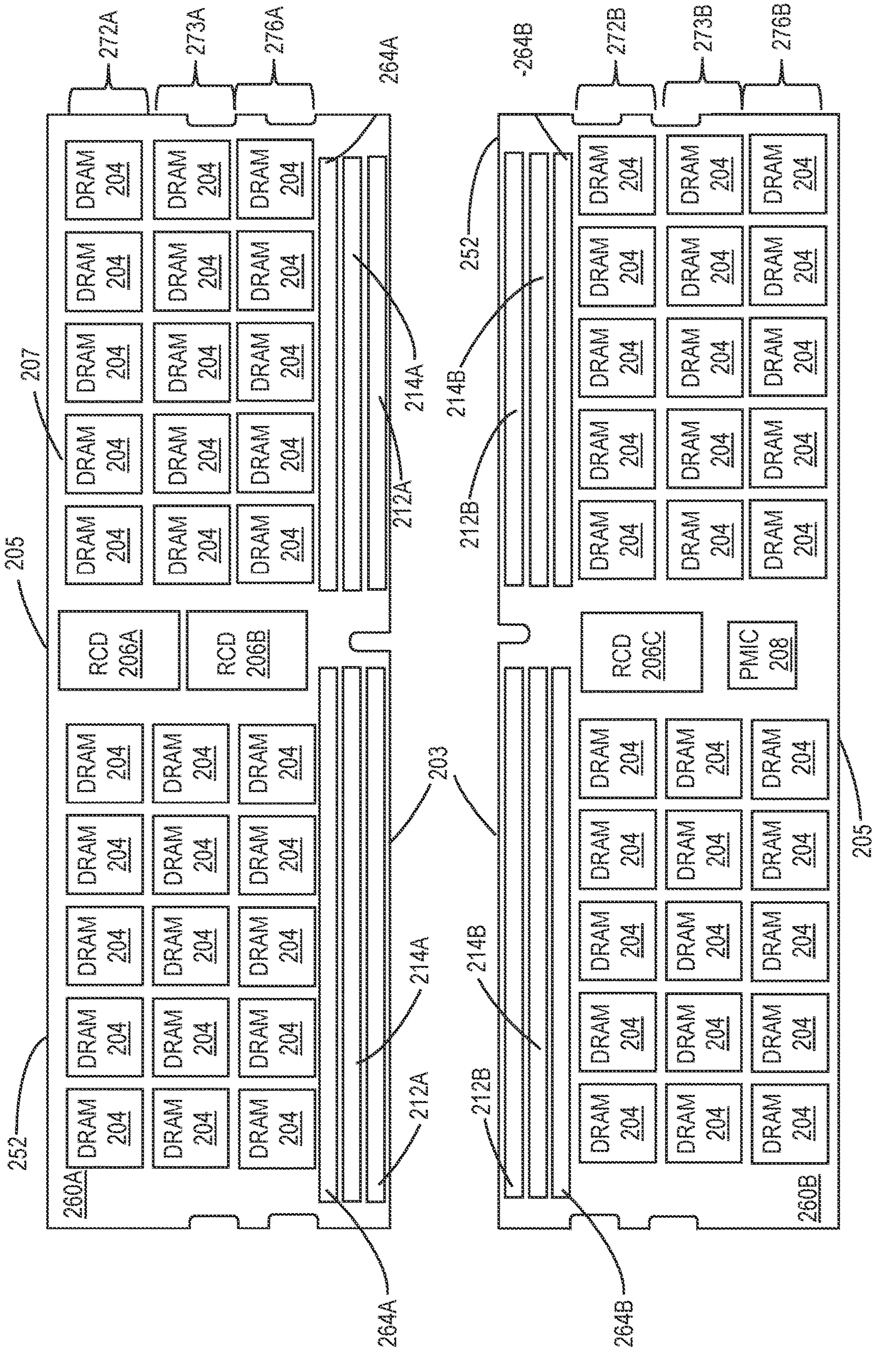
FIG. 2E illustrates a block diagram of an example of a three-channel memory module.

Turning first to FIG. 2E, the memory module 252 includes three rows of conductive contacts aligned over one another. For example, the memory module 252 includes rows 212A, 214A, and 264A of conductive contacts on the first face 260A and rows 212B, 214B, and 264B of conductive contacts on the second face of the memory module 252. In this example, on the first side 260A, the first or bottom row 212A of conductive contacts is proximate to the edge 203 of the memory module 252 to be received by a connector (e.g., the connector 256 of FIG. 2F). The middle row 214A of conductive contacts is between the bottom row 212A of conductive contacts and a top row 264A of conductive contacts. Similarly, on the second side 260B, the first or bottom row 212B of conductive contacts is proximate to the edge 203. The middle row 214B of conductive contacts is between the bottom row 212B of conductive contacts and a top row 264B of conductive contacts.

FIG. 2E also illustrates an example of a memory module 252 having three rows of DRAM chips 204 on each side of the module 252. For example, side 260A includes the rows 272A, 273A, and 276A of DRAM chips 204. Similarly side 260B includes the rows 272B, 273B, and 276B of DRAM chips 204. In one example, one or more rows of DRAM chips provides memory capacity for a memory channel. In one such example, the rows 272A and 272B provide memory capacity for a first memory channel, the rows 273A and 273B provide memory capacity for a second memory channel, and the rows 276A and 276B provide memory capacity for a third memory channel. In one such example, each of the three rows of conductive contacts are also to couple with an independent memory channel. For example, the rows 212A and 212B of conductive contacts are to couple with the first channel, the rows 214A and 214B are to couple with the second channel, and the rows 264A and 264B are to couple with the third channel. Other configurations and ordering are possible. For example, the grouping of the DRAM chips corresponding to a channel may not be in a single row on the module as illustrated. In the example of FIG. 2E, the memory module 252 includes three registered or registering clock drivers (RCDs) 206A, 206B, and 206C (e.g., one RCD per channel). The memory module 252 also includes a shared power management integrated circuit (PMIC) 208.

Figure 2F:
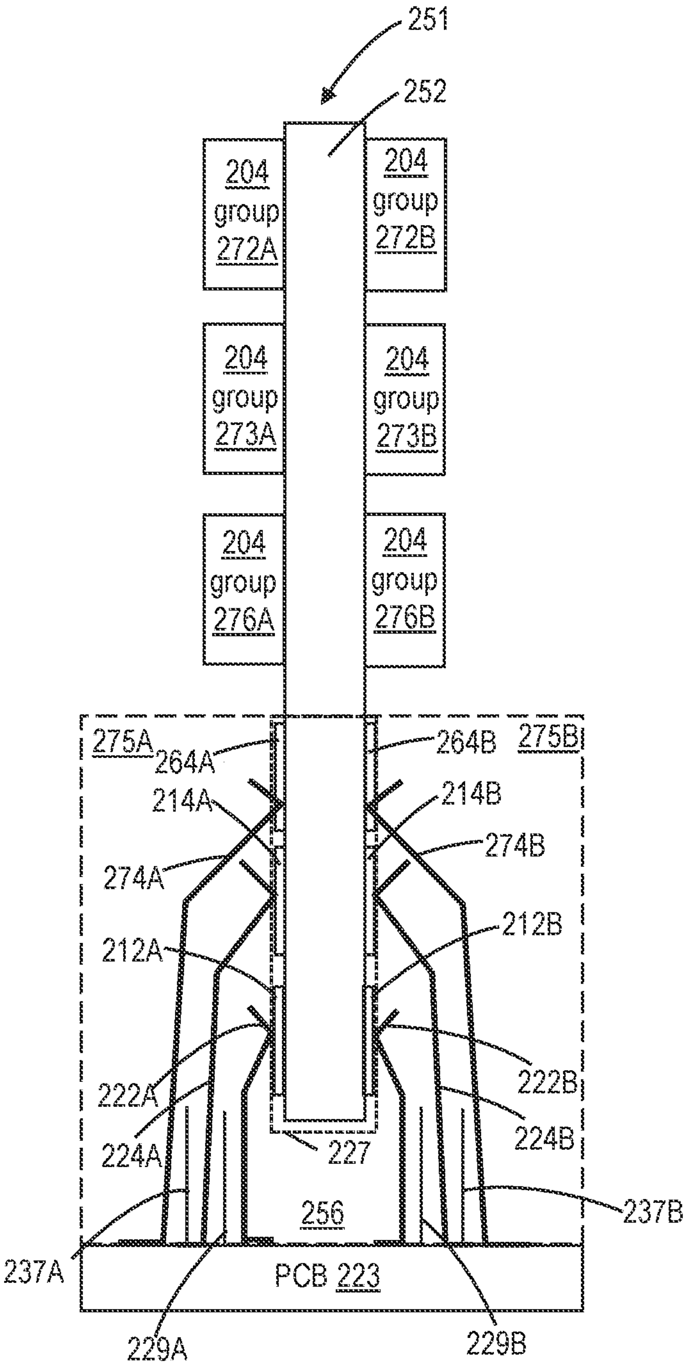
FIG. 2F illustrates a block diagram of an example of a three-channel memory module in a connector.

Referring to FIG. 2F, the bottom row 212A, 212B of conductive contacts are to couple with a plurality of inner pins 222A, 222B of the connector 256. The top row 264A, 264B of conductive contacts are to couple with a plurality of outer pins 274A, 274B of the connector 256. The middle row 214A, 214B of conductive contacts are to couple with a plurality of pins 224A, 224B between the plurality of inner pins 222A, 222B and the plurality of outer pins 274A, 274B. In one example, in addition to the first ground plane 229A between the pins 222A and 224A, and a second ground plane 229B between the pins 222B and 224B, the connector 256 includes a ground plane 237A between the pin 274A and the pin 224A, and a ground plane 237B between the pin 274B and the pin 224B. Thus, the connector 256 includes three sets of pins on each of the sides 275A, 275B of the connector 256 to couple with the corresponding three rows of conductive contacts of the memory module 252. The three rows of conductive contacts and corresponding connector can enable three independent memory channels on the memory module 252. In one example, each row of pins on a side of the connector 256 is to couple with a memory channel. For example, the inner pins 222A, 222B are to couple with one channel, the pins 224A, 224B are to couple with a second channel, and the outer pins 274A, 274B are to couple with a third channel. Thus, a memory module with three rows of conductive contacts can couple with a connector having corresponding pins to provide for three independent memory channels on a single memory module.

Figure 3:
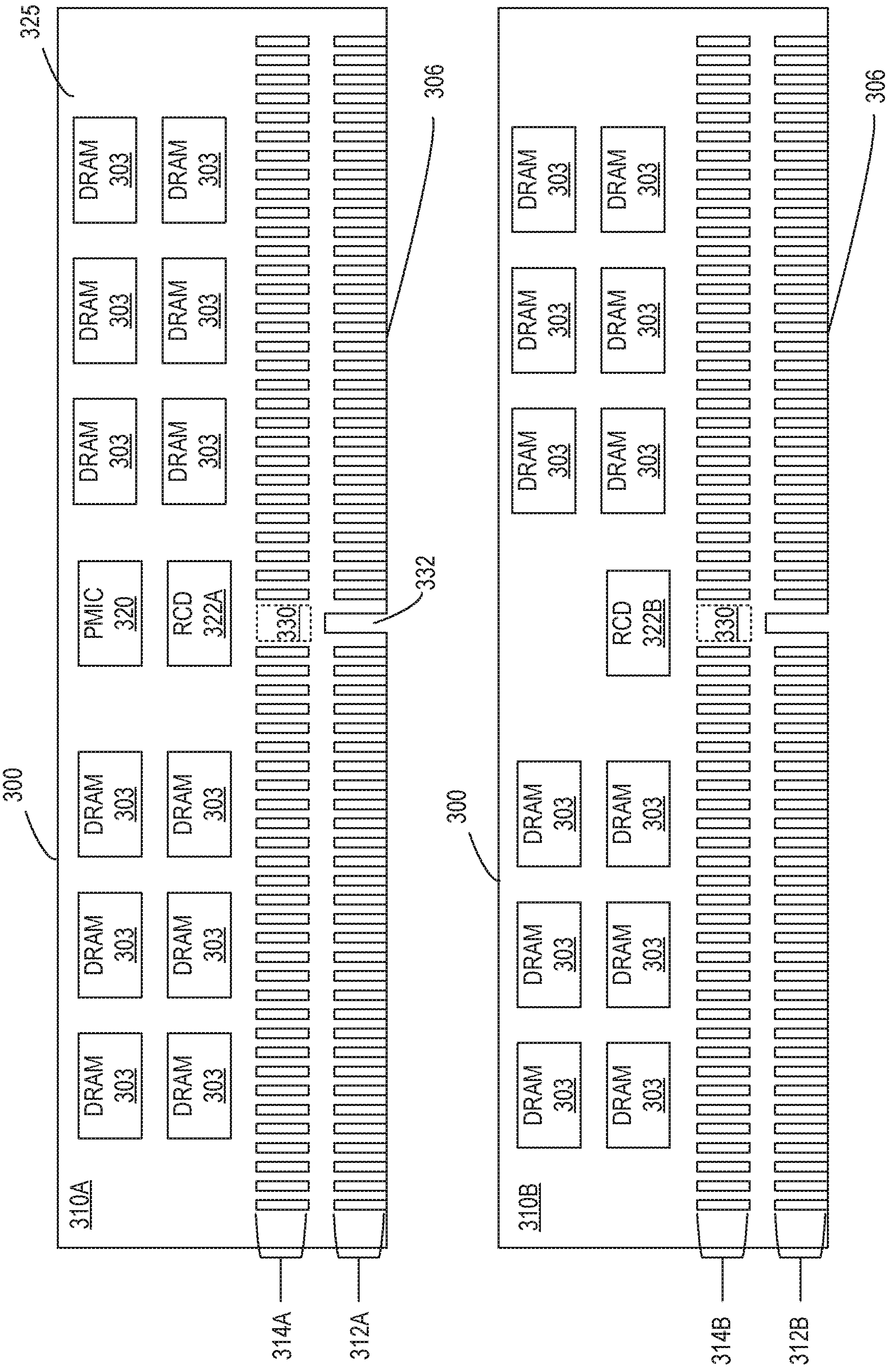
FIG. 3 illustrates front and back faces of an example of a two-channel memory module.

FIG. 3 illustrates front and back faces or sides 310A and 310B of an example of a two-channel memory module 300. Note that the components of the memory module 300 of FIG. 3 are for illustrative purposes and are not drawn to scale. The memory module 300 includes a PCB 325. The memory module 300 has an edge 306 to be received by a connector, such as the connector 216 of FIGS. 2B and 2D. In the illustrated example, the memory module 300 has a notch 332 at the edge 306 in correspondence with a memory standard to prevent the memory module 300 from being installed or inserted into an incompatible connector. Other memory modules may include a notch in a different location, or more than one notch.

The memory module 300 includes a plurality of memory chips (e.g., DRAM chips) 303 on the PCB 325 of the memory module 300. Although FIG. 3 depicts twelve DRAM chips 303 on each side 310A, 310B of the memory module 300, other memory modules may include a different number of DRAM chips on one or both sides of the memory module (e.g., one, two, four, eight, sixteen, twenty, or another number of memory chips). The memory module includes an RCD on each side of the memory module 300 (e.g., RCD 322A on a first side 310A and RCD 322B on a second side 310B). In the illustrated example, the first RCD 322A is on a first face 310A of the PCB 325, and the second RCD 322B is on a second face of the PCB 325; however, other examples may include multiple RCDs on the same face or side. The memory module 300 also include a PMIC 320.

The memory module 300 includes two rows of conductive contacts on each side 310A, 310B. For example, the memory module 300 includes a first row (or bottom row) 312A of conductive contacts and a second row (or top row) 314A of conductive contacts on side 310A. The memory module 300 includes a first row (or bottom row) 312B of conductive contacts and a second row (or top row) 314B of conductive contacts on side 310B. The rows 312A, 314A, 312B, and 314B of conductive contacts may be the same as, or similar to, the conductive contacts in rows 212A, 214A, 212B, and 214B of FIGS. 2A-2D. As can be seen in FIG. 3, each of the rows 312A, 314A, 312B, and 314B include a plurality of conductive contacts aligned in a row. In one example, the conductive contacts of rows 312A, 314A, 312B, and 314B include conductive fingers (e.g., gold fingers) to connect to corresponding contacts exposed in the slot of a DIMM connector.

In one example, the dimensions (e.g., length) of the memory module 300 and the conductive contacts of each of the rows 312A, 314A, 312B, and 314B has a number and pitch in correspondence with a standard, such as DDR5 or other memory standard. FIG. 3 illustrates an example in which the top row (e.g., 314A) and bottom row (e.g., 312A) of conductive contacts have the same number of contacts aligned over one another. Thus, the number of conductive contacts is double that of a conventional memory module. However, in another example, the top row can include one or more additional contacts in the space 330 over the notch 332 (e.g., key notch) on the edge 306 of the memory module 300. Note that the number of conductive contacts shown in FIG. 3 is for illustrative purposes only; other numbers of conductive contacts are possible.

Referring again to the RCDs 322A and 322B, although the memory module 300 is shown as having two RCDs, in other examples, a single RCD can be used for both channels of a two-channel memory module. For example, FIGS. 4A-4C illustrate block diagrams of examples of memory modules with different RCD configurations.

Figure 4A:
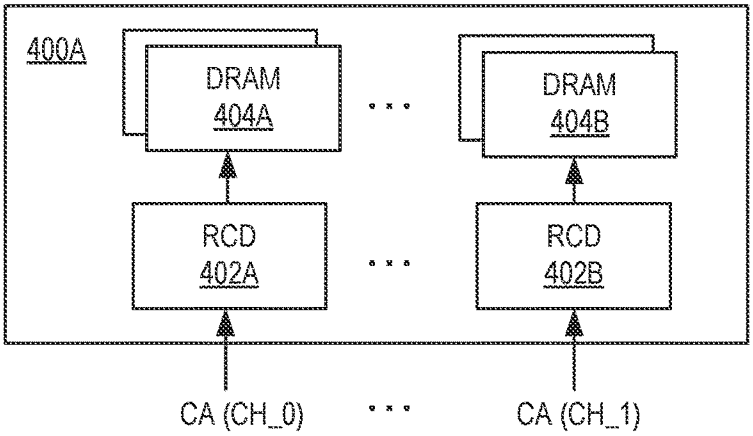
FIGS. 4A-4C illustrate block diagrams of examples of memory modules with different registering clock driver (RCD) configurations.

FIG. 4A illustrates a memory module 400A with RCD circuitry for each channel on the memory module 400A. For example, if there are two channels (CH_0 and CH_1), the memory modules 400A includes a first RCD 402A to receive command and address signals for a first of two memory channels (e.g., CH_0), and a second RCD 402B to receive command and address signals for a second of the two memory channels (CH_1). In the illustrated example, the RCD 402A forwards CA signals for CH_0 to DRAMs 404A and the RCD 402B forwards CA signals for CH_1 to DRAMs 404B. Including two RCDs (e.g., one RCD per channel of the memory module) can enable load reduction as well as enable independent operation of the two channels of the DIMM. As indicated by the ellipses, the memory module may include more than two RCDs (e.g., three or more RCDs) to support more than two channels. In one such example, the memory module includes one RCD for each channel supported on the memory module.

Figure 4B:
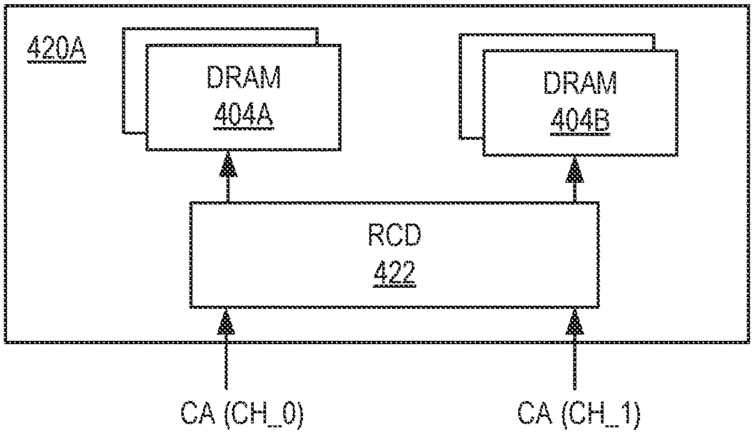

FIG. 4B illustrates another example in which the memory module 420A includes two functional RCDs packaged into a single RCD chip 422. In one such example, the RCD 422 includes circuitry to receive, buffer, and transmit the command and address signals for both channels CH_0 and CH_1 in parallel and independently. In the examples of FIGS. 4A and 4B, the independent RCD circuitry enables the frontside and backside CA buses for both channels to be run at the same frequency (e.g., both channels can be run at a data rate in accordance with a standard such as DDR5).

Figure 4C:
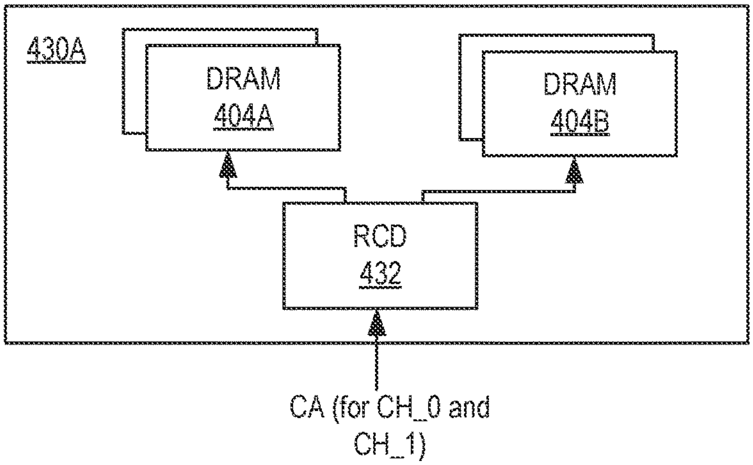

FIG. 4C illustrates another example of a two-channel memory module 430A that includes a single functional RCD 432 to receive command and address signals for both of the two memory channels CH_0 and CH_1. In one such example, the CA signals for the two channels can be interleaved or multiplexed to enable sharing of the same RCD circuitry. Having a single RCD for a two-channel memory module can reduce cost but may also reduce performance and functionality. For example, the two channels share the same RCD 432 and thus cannot operate in parallel. In one such example, the front side CA bus (e.g., host-side) can be operated at a double data rate (DDR) and the back side CA bus (e.g., between the RCD and the DRAMs) can be operated at a single data rate (SDR) to address signal integrity issues associated with sharing the same RCD for two channels.

Figure 5:
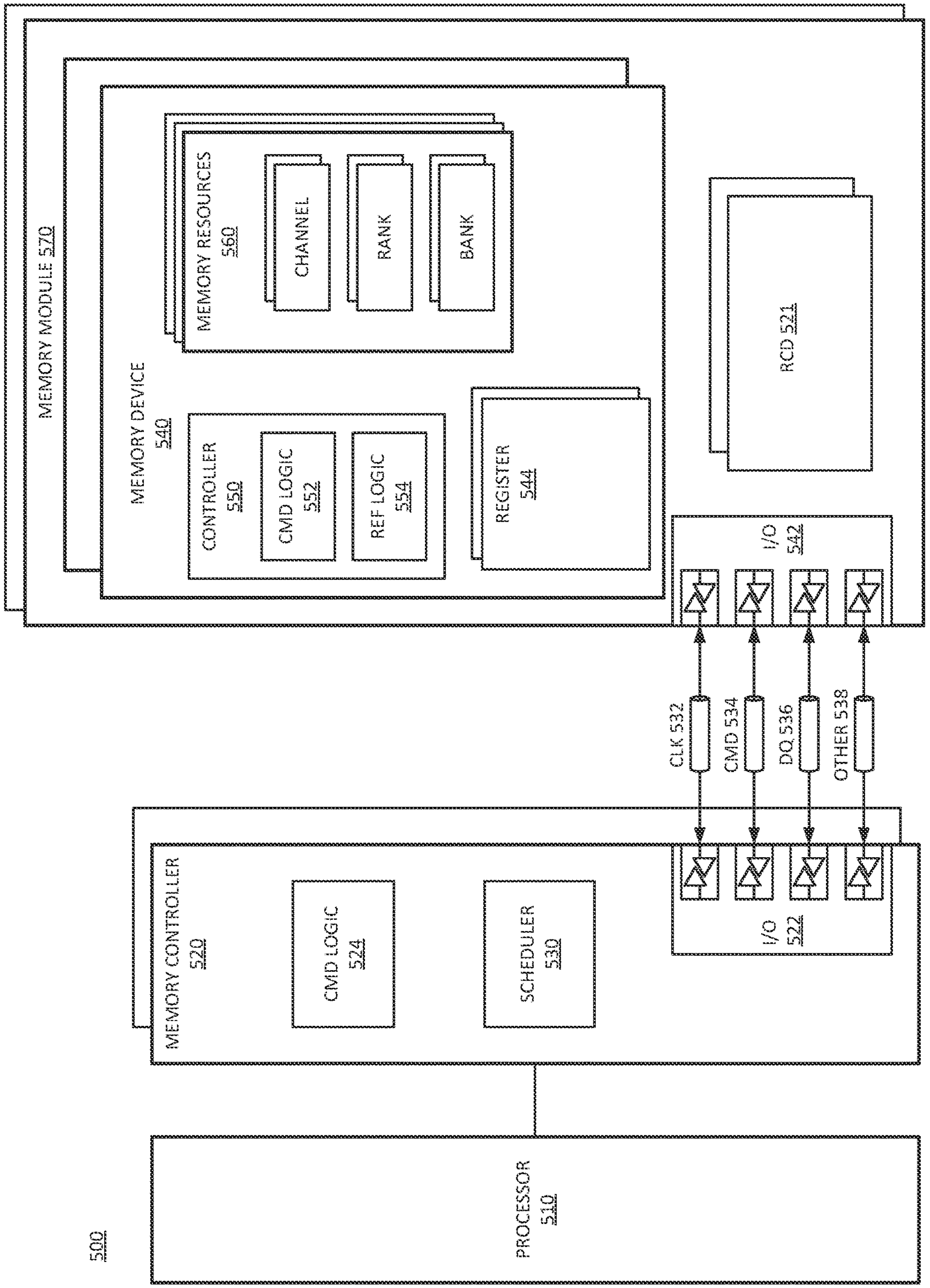
FIG. 5 is a block diagram of an example of a memory subsystem in which multi-channel memory modules may be implemented.

FIG. 5 is a block diagram of an embodiment of a memory subsystem in which multi-channel modules can be implemented. System 500 includes a processor and elements of a memory subsystem in a computing device. Processor 510 represents a processing unit of a computing platform that may execute an operating system (OS) and applications, which can collectively be referred to as the host or the user of the memory. The OS and applications execute operations that result in memory accesses. Processor 510 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 500 can be implemented as an SOC (system on a chip) or be implemented with standalone components.

Reference to memory devices can apply to different memory types. Memory devices often refers to volatile memory technologies. Volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, originally published in September 2012 by JEDEC), DDR5 (DDR version 5, originally published in July 2020), LPDDR3 (Low Power DDR version 3, JESD209-3B, August 2013 by JEDEC), LPDDR4 (LPDDR version 4, JESD209-4, originally published by JEDEC in August 2014), LPDDR5 (LPDDR version 5, JESD209-5A, originally published by JEDEC in January 2020), WIO2 (Wide Input/Output version 2, JESD229-2 originally published by JEDEC in August 2014), HBM (High Bandwidth Memory, JESD235, originally published by JEDEC in October 2013), HBM2 (HBM version 2, JESD235C, originally published by JEDEC in January 2020), or HBM3 (HBM version 3 currently in discussion by JEDEC), or others or combinations of memory technologies, and technologies based on derivatives or extensions of such specifications. The JEDEC standards are available at www.jedec.org.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 520 represents one or more memory controller circuits or devices for system 500. Memory controller 520 represents control logic that generates memory access commands in response to the execution of operations by processor 510. Memory controller 520 accesses one or more memory devices 540. Memory devices 540 can be DRAM devices in accordance with any referred to above. In one embodiment, memory devices 540 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 520 manages a separate memory channel, although system 500 can be configured to have multiple channels managed by a single controller, or to have multiple controllers on a single channel. In one embodiment, memory controller 520 is part of host processor 510, such as logic implemented on the same die or implemented in the same package space as the processor.

Memory controller 520 includes I/O interface logic 522 to couple to a memory bus, such as a memory channel as referred to above. I/O interface logic 522 (as well as I/O interface logic 542 of memory device 540) can include pins, pads, connectors, signal lines, traces, or wires, or other hardware to connect the devices, or a combination of these. I/O interface logic 522 can include a hardware interface. As illustrated, I/O interface logic 522 includes at least drivers/transceivers for signal lines. Commonly, wires within an integrated circuit interface couple with a pad, pin, or connector to interface signal lines or traces or other wires between devices. I/O interface logic 522 can include drivers, receivers, transceivers, or termination, or other circuitry or combinations of circuitry to exchange signals on the signal lines between the devices. The exchange of signals includes at least one of transmit or receive. While shown as coupling I/O 522 from memory controller 520 to I/O 542 of memory device 540, it will be understood that in an implementation of system 500 where groups of memory devices 540 are accessed in parallel, multiple memory devices can include I/O interfaces to the same interface of memory controller 520. In an implementation of system 500 including one or more memory modules 570, I/O 542 can include interface hardware of the memory module in addition to interface hardware on the memory device itself. Other memory controllers 520 will include separate interfaces to other memory devices 540.

The bus between memory controller 520 and memory devices 540 can be implemented as multiple signal lines coupling memory controller 520 to memory devices 540. The bus may typically include at least clock (CLK) 532, command/address (CMD) 534, and write data (DQ) and read data (DQ) 536, and zero or more other signal lines 538. In one embodiment, a bus or connection between memory controller 520 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one embodiment, independent channels have different clock signals, C/A buses, data buses, and other signal lines. Thus, system 500 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 520 and memory devices 540. An example of a serial bus technology is 8B10B encoding and transmission of high-speed data with embedded clock over a single differential pair of signals in each direction. In one embodiment, CMD 534 represents signal lines shared in parallel with multiple memory devices. In one embodiment, multiple memory devices share encoding command signal lines of CMD 534, and each has a separate chip select (CS_n) signal line to select individual memory devices.

It will be understood that in the example of system 500, the bus between memory controller 520 and memory devices 540 includes a subsidiary command bus CMD 534 and a subsidiary bus to carry the write and read data, DQ 536. In one embodiment, the data bus can include bidirectional lines for read data and for write/command data. In another embodiment, the subsidiary bus DQ 536 can include unidirectional write signal lines for write and data from the host to memory and can include unidirectional lines for read data from the memory to the host. In accordance with the chosen memory technology and system design, other signals 538 may accompany a bus or sub bus, such as strobe lines DQS. Based on design of system 500, or implementation if a design supports multiple implementations, the data bus can have more or less bandwidth per memory device 540. For example, the data bus can support memory devices that have either a ×32 interface, a ×16 interface, a ×8 interface, or other interface. The convention "×W," where W is an integer that refers to an interface size or width of the interface of memory device 540, which represents a number of signal lines to exchange data with memory controller 520. The interface size of the memory devices is a controlling factor on how many memory devices can be used concurrently per channel in system 500 or coupled in parallel to the same signal lines. In one embodiment, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one embodiment, memory devices 540 and memory controller 520 exchange data over the data bus in a burst, or a sequence of consecutive data transfers. The burst corresponds to a number of transfer cycles, which is related to a bus frequency. In one embodiment, the transfer cycle can be a whole clock cycle for transfers occurring on a same clock or strobe signal edge (e.g., on the rising edge). In one embodiment, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 540 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 540 represent memory resources for system 500. In one embodiment, each memory device 540 is a separate memory die. In one embodiment, each memory device 540 can interface with multiple (e.g., 2) channels per device or die. Each memory device 540 includes I/O interface logic 542, which has a bandwidth determined by the implementation of the device (e.g., ×16 or ×8 or some other interface bandwidth). I/O interface logic 542 enables the memory devices to interface with memory controller 520. I/O interface logic 542 can include a hardware interface and can be in accordance with I/O 522 of memory controller, but at the memory device end. In one embodiment, multiple memory devices 540 are connected in parallel to the same command and data buses. In another embodiment, multiple memory devices 540 are connected in parallel to the same command bus and are connected to different data buses. For example, system 500 can be configured with multiple memory devices 540 coupled in parallel, with each memory device responding to a command, and accessing memory resources 560 internal to each. For a Write operation, an individual memory device 540 can write a portion of the overall data word, and for a Read operation, an individual memory device 540 can fetch a portion of the overall data word. As non-limiting examples, a specific memory device can provide or receive, respectively, 8 bits of a 128-bit data word for a Read or Write transaction, or 8 bits or 16 bits (depending for a ×8 or a ×16 device) of a 256-bit data word. The remaining bits of the word will be provided or received by other memory devices in parallel.

In one embodiment, memory devices 540 are disposed directly on a motherboard or host system platform (e.g., a PCB (printed circuit board) on which processor 510 is disposed) of a computing device. In one embodiment, memory devices 540 can be organized into memory modules 570. In one embodiment, memory modules 570 represent dual inline memory modules (DIMMs). In one embodiment, memory modules 570 represent other organization of multiple memory devices to share at least a portion of access or control circuitry, which can be a separate circuit, a separate device, or a separate board from the host system platform. Memory modules 570 can include multiple memory devices 540, and the memory modules can include support for multiple separate channels to the included memory devices disposed on them. In another embodiment, memory devices 540 may be incorporated into the same package as memory controller 520, such as by techniques such as multi-chip-module (MCM), package-on-package, through-silicon via (TSV), or other techniques or combinations. Similarly, in one embodiment, multiple memory devices 540 may be incorporated into memory modules 570, which themselves may be incorporated into the same package as memory controller 520. It will be appreciated that for these and other embodiments, memory controller 520 may be part of host processor 510.

Memory devices 540 each include memory resources 560. Memory resources 560 represent individual arrays of memory locations or storage locations for data. Typically, memory resources 560 are managed as rows of data, accessed via wordline (rows) and bitline (individual bits within a row) control. Memory resources 560 can be organized as separate channels, ranks, and banks of memory. Channels may refer to independent control paths to storage locations within memory devices 540. A rank refers to memory devices coupled with the same chip select. Ranks may refer to common locations across multiple memory devices (e.g., same row addresses within different devices). Banks may refer to arrays of memory locations within a memory device 540. In one embodiment, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 540 include one or more registers 544. Register 544 represents one or more storage devices or storage locations that provide configuration or settings for the operation of the memory device. In one embodiment, register 544 can provide a storage location for memory device 540 to store data for access by memory controller 520 as part of a control or management operation. In one embodiment, register 544 includes one or more Mode Registers. In one embodiment, register 544 includes one or more multipurpose registers. The configuration of locations within register 544 can configure memory device 540 to operate in different "modes," where command information can trigger different operations within memory device 540 based on the mode. Additionally, or in the alternative, different modes can also trigger different operation from address information or other signal lines depending on the mode. Settings of register 544 can indicate configuration for I/O settings (e.g., timing, termination or ODT (on-die termination), driver configuration, or other I/O settings).

Memory device 540 includes controller 550, which represents control logic within the memory device to control internal operations within the memory device. For example, controller 550 decodes commands sent by memory controller 520 and generates internal operations to execute or satisfy the commands. Controller 550 can be referred to as an internal controller and is separate from memory controller 520 of the host. Controller 550 can determine what mode is selected based on register 544 and configure the internal execution of operations for access to memory resources 560 or other operations based on the selected mode. Controller 550 generates control signals to control the routing of bits within memory device 540 to provide a proper interface for the selected mode and direct a command to the proper memory locations or addresses. Controller 550 includes command logic 552, which can decode command encoding received on command and address signal lines. Thus, command logic 552 can be or include a command decoder. With command logic 552, memory device can identify commands and generate internal operations to execute requested commands.

Referring again to memory controller 520, memory controller 520 includes command (CMD) logic 524, which represents logic or circuitry to generate commands to send to memory devices 540. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 540, memory controller 520 can issue commands via I/O 522 to cause memory device 540 to execute the commands. In one embodiment, controller 550 of memory device 540 receives and decodes command and address information received via I/O 542 from memory controller 520. Based on the received command and address information, controller 550 can control the timing of operations of the logic and circuitry within memory device 540 to execute the commands. Controller 550 is responsible for compliance with standards or specifications within memory device 540, such as timing and signaling requirements. Memory controller 520 can implement compliance with standards or specifications by access scheduling and control.

Memory controller 520 includes scheduler 530, which represents logic or circuitry to generate and order transactions to send to memory device 540. From one perspective, the primary function of memory controller 520 could be said to schedule memory access and other transactions to memory device 540. Such scheduling can include generating the transactions themselves to implement the requests for data by processor 510 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 520 typically includes logic such as scheduler 530 to allow selection and ordering of transactions to improve performance of system 500. Thus, memory controller 520 can select which of the outstanding transactions should be sent to memory device 540 in which order, which is typically achieved with logic much more complex that a simple first-in first-out algorithm. Memory controller 520 manages the transmission of the transactions to memory device 540, and manages the timing associated with the transaction. In one embodiment, transactions have deterministic timing, which can be managed by memory controller 520 and used in determining how to schedule the transactions with scheduler 530.

Referring again to the memory module 570, in one example, an RCD 521 is included on the module 570 to buffer signals between the memory controller and the memory devices and control the timing and signaling to the DRAMs. In some examples, a buffer device is referred to as a register or a registered or registering clock driver (RCD). The term RCD is used throughout the Specification and Figures; however, the examples may apply to other buffer devices (e.g., a CXL buffer or other buffering device). For example, the examples described herein can be extended to CXL buffer-based high bandwidth DIMMs where the data buffer logic is integrated into the buffer device. The RCD 521 receives command and clock signals from the memory controller 520 and forwards them to the memory devices in accordance with relevant protocols and standard specifications. For example, the RCD 521 may be in compliance with the DDR4 Registering Clock Driver Specification (DDR4RCD02 JESD82-31A), the DDR5 Registering Clock Driver Specification (DDR5RCD02 currently in discussion by JEDEC), or other RCD standards.

In one example, the memory modules 570 can be multi-channel memory modules in accordance with examples described herein.

Figure 6:
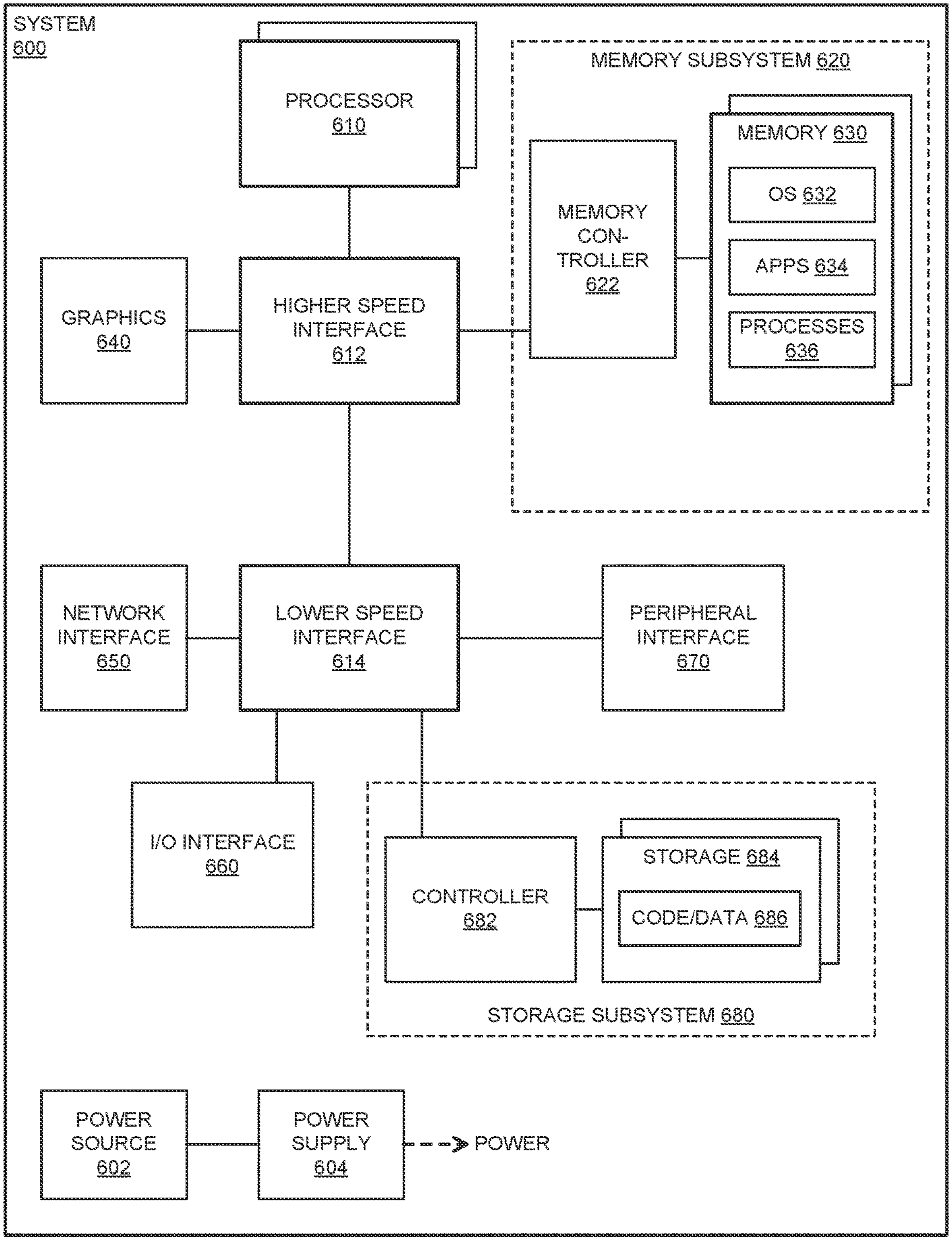
FIG. 6 is a block diagram of an embodiment of a computing system that can include a multi-channel memory module.

FIG. 6 is a block diagram of an embodiment of a computing system that can include multi-channel memory modules. System 600 represents a computing device in accordance with any embodiment described herein, and can be a laptop computer, a desktop computer, a tablet computer, a server, a gaming or entertainment control system, a scanner, copier, printer, routing or switching device, embedded computing device, a smartphone, a wearable device, an internet-of-things device, or other electronic device.

System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 600 includes interface 612 coupled to processor 610, which can represent a higher speed interface or a high throughput interface for system components that needs higher bandwidth connections, such as memory subsystem 620 or graphics interface components 640. Interface 612 represents an interface circuit, which can be a standalone component or integrated onto a processor die. Where present, graphics interface 640 interfaces to graphics components for providing a visual display to a user of system 600. In one embodiment, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one embodiment, the display can include a touchscreen display. In one embodiment, graphics interface 640 generates a display based on data stored in memory 630 or based on operations executed by processor 610 or both. In one embodiment, graphics interface 640 generates a display based on data stored in memory 630 or based on operations executed by processor 610 or both.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, one or more varieties of random-access memory (RAM) such as DRAM, or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one embodiment, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one embodiment, system 600 includes interface 614, which can be coupled to interface 612. Interface 614 can be a lower speed interface than interface 612. In one embodiment, interface 614 represents an interface circuit, which can include standalone components and integrated circuitry. In one embodiment, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can exchange data with a remote device, which can include sending data stored in memory or receiving data to be stored in memory.

In one embodiment, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one embodiment, system 600 includes storage subsystem 680 to store data in a nonvolatile manner. In one embodiment, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one embodiment, storage subsystem 680 includes controller 682 to interface with storage 684. In one embodiment controller 682 is a physical part of interface 614 or processor 610 or can include circuits or logic in both processor 610 and interface 614.

Power source 602 provides power to the components of system 600. More specifically, power source 602 typically interfaces to one or multiple power supplies 604 in system 600 to provide power to the components of system 600. In one embodiment, power supply 604 includes an AC to DC (alternating current to direct current) adapter to plug into a wall outlet. Such AC power can be renewable energy (e.g., solar power) power source 602. In one embodiment, power source 602 includes a DC power source, such as an external AC to DC converter. In one embodiment, power source 602 or power supply 604 includes wireless charging hardware to charge via proximity to a charging field. In one embodiment, power source 602 can include an internal battery or fuel cell source.

Thus, multi-channel memory modules including multiple rows of conductive contacts can enable coupling a single memory module with multiple memory channels. Coupling multiple channels to a single memory module can enable operating the channels in parallel, increasing memory bandwidth.

Examples of a multi-channel memory module follow:

Example 1: a memory module including: a printed circuit board (PCB) having a first face, a second face, and a first edge to be received by a connector, a plurality of memory chips on at least one of the first and second faces of the PCB, and two rows of conductive contacts on each of the first and second faces of the PCB. The two rows including a first row of conductive contacts proximate to the first edge of the PCB to be received by the connector, and a second row of conductive contacts between the first row and a second edge of the PCB opposite to the first edge.

Example 2: the memory module of example 1, wherein the second row of conductive contacts is between the first row and the plurality of memory chips.

Example 3: the memory module of examples 1 or 2, wherein the first row of conductive contacts is to couple with a plurality of inner pins of the connector, and the second row of conductive contacts is to couple with a plurality of outer pins of the connector.

Example 4: the memory module of any of examples 1-3, wherein the two rows of conductive contacts on each of the first and second faces of the PCB are to couple with two memory channels.

Example 5: The memory module of example 4, wherein the first and second rows of conductive contacts on the first face of the PCB are to couple with a first memory channel, and the first and second rows of conductive contacts on the second face of the PCB are to couple with a second memory channel.

Example 6: the memory module of example 4, further including a single registering clock driver (RCD) on the PCB, the single RCD to receive command and address signals for both of the two memory channels.

Example 7: the memory module of example 4, further including a first registering clock driver (RCD) on the PCB to receive command and address signals for a first of the two memory channels, and a second RCD on the PCB to receive command and address signals for a second of the two memory channels.

Example 8: the memory module of example 7, wherein the first RCD is on a first face of the PCB, and the second RCD is on a second face of the PCB.

Example 9: the memory module of example 7, wherein the first RCD and the second RCD are on the same face of the PCB.

Example 10: the memory module of any of examples 1-9, further including a third row of conductive contacts between the first row and the second row of conductive contacts.

Example 11: the memory module of example 10, wherein the first row of conductive contacts is to couple with a plurality of inner pins of the connector, the second row of conductive contacts is to couple with a plurality of outer pins of the connector, and the third row of conductive contacts is to couple with a plurality of pins between the plurality of inner pins and the plurality of outer pins.

Example 12: a dual-inline memory module (DIMM) including: a printed circuit board (PCB) having a first face, a second face, and an edge to be received by a DIMM connector, a plurality of DRAM chips on each of the first and second faces of the PCB, a bottom row of conductive contacts on each of the first and second faces of the PCB at the edge of the PCB to be received by the DIMM connector, and a top row of conductive contacts on each of the first and second faces of the PCB, wherein the top row is aligned over and parallel to the bottom row of conductive contacts.

Example 13: the DIMM of example 12, wherein the top row of conductive contacts is between the bottom row and the plurality of DRAM chips.

Example 14: the DIMM of examples 12 or 13, wherein the bottom row of conductive contacts is to couple with a plurality of inner pins of the DIMM connector, and the top row of conductive contacts is to couple with a plurality of outer pins of the DIMM connector.

Example 15: the DIMM of any of examples 12-14, wherein the bottom rows and the top rows of conductive contacts on each of the first and second faces of the PCB are to couple with two memory channels.

Example 16: the DIMM of example 14, wherein the bottom rows and the top rows of conductive contacts on the first face of the PCB are to couple with a first memory channel, and the bottom rows and the top rows of conductive contacts on the second face of the PCB are to couple with a second memory channel.

Example 17: a system including: a processor, and a memory module coupled with the processor. The memory module includes a printed circuit board (PCB) having a first face, a second face, and a first edge to be received by a connector, a plurality of memory chips on at least one of the first and second faces of the PCB, and two rows of conductive contacts on each of the first and second faces of the PCB, the two rows including a first row of conductive contacts proximate to the first edge of the PCB to be received by the connector, and a second row of conductive contacts between the first row and a second edge of the PCB opposite to the first edge.

Example 18: the system of example 17, wherein the memory module is in accordance with any of examples 1-16.

Example 19: the system of examples 17 or 18, further including a motherboard including the connector.

Example 20: the system of any of examples 17-19, further including one or more of: a display, a battery, and a power supply.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

The hardware design embodiments discussed above may be embodied within a semiconductor chip and/or as a description of a circuit design for eventual targeting toward a semiconductor manufacturing process. In the case of the later, such circuit descriptions may take of the form of a (e.g., VHDL or Verilog) register transfer level (RTL) circuit description, a gate level circuit description, a transistor level circuit description or mask description or various combinations thereof. Circuit descriptions are typically embodied on a computer readable storage medium (such as a CD-ROM or other type of storage technology).

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory module comprising:

a printed circuit board (PCB) having a first face, a second face, and a first edge to be received by a connector;

a plurality of memory chips on at least one of the first and second faces of the PCB; and two rows of conductive contacts on each of the first and second faces of the PCB, the two rows including a first row of conductive contacts proximate to the first edge of the PCB to be received by the connector, and a second row of conductive contacts between the first row and a second edge of the PCB opposite to the first edge, wherein the first and second rows of conductive contacts on the first face of the PCB are to couple only with a first memory channel, and the first and second rows of conductive contacts on the second face of the PCB are to couple only with a second memory channel.

2. The memory module of claim 1, wherein:

the second row of conductive contacts is between the first row and the plurality of memory chips.

3. The memory module of claim 1, wherein:

the first row of conductive contacts is to couple with a plurality of inner pins of the connector; and the second row of conductive contacts is to couple with a plurality of outer pins of the connector.

4. The memory module of claim 1, further comprising:

a single registering clock driver (RCD) on the PCB, the single RCD to receive command and address signals for both of the first and second memory channels.

5. The memory module of claim 1, further comprising:

a first registering clock driver (RCD) on the PCB to receive command and address signals for the first memory channel; and a second RCD on the PCB to receive command and address signals for the second memory channel.

6. The memory module of claim 5, wherein:

the first RCD is on a first face of the PCB; and the second RCD is on a second face of the PCB.

7. The memory module of claim 1, further comprising:

a third row of conductive contacts between the first row and the second row of conductive contacts, wherein the third row of conductive contacts on the first face of the PCB is to couple only with a third memory channel, and the third row of conductive contacts on the second face of the PCB are to couple only with the third memory channel.

8. The memory module of claim 7, wherein:

the first row of conductive contacts is to couple with a plurality of inner pins of the connector;

the second row of conductive contacts is to couple with a plurality of outer pins of the connector; and the third row of conductive contacts is to couple with a plurality of pins between the plurality of inner pins and the plurality of outer pins.

9. A dual-inline memory module (DIMM) comprising:

a printed circuit board (PCB) having a first face, a second face, and an edge to be received by a DIMM connector;

a plurality of DRAM chips on each of the first and second faces of the PCB;

a bottom row of conductive contacts on each of the first and second faces of the PCB at the edge of the PCB to be received by the DIMM connector; and a top row of conductive contacts on each of the first and second faces of the PCB, wherein the top row is aligned over and parallel to the bottom row of conductive contacts, wherein the bottom rows and the top rows of conductive contacts on the first face of the PCB are to only couple with a first memory channel, and the bottom rows and the top rows of conductive contacts on the second face of the PCB are to couple only with a second memory channel.

10. The DIMM of claim 9, wherein:

the top row of conductive contacts is between the bottom row and the plurality of DRAM chips.

11. The DIMM of claim 9, wherein:

the bottom row of conductive contacts is to couple with a plurality of inner pins of the DIMM connector; and the top row of conductive contacts is to couple with a plurality of outer pins of the DIMM connector.

12. The DIMM of claim 9, further comprising:

a single registering clock driver (RCD) on the PCB, the single RCD to receive command and address signals for both of the first and second memory channel.

13. The DIMM of claim 9, further comprising:

a first registering clock driver (RCD) on the PCB to receive command and address signals for the first memory channel; and a second RCD on the PCB to receive command and address signals for the second memory channel.

14. The DIMM of claim 13, wherein:

the first RCD is on a first face of the PCB; and the second RCD is on a second face of the PCB.

15. A system comprising:

a processor; and a memory module coupled with the processor, the memory module including:

a printed circuit board (PCB) having a first face, a second face, and a first edge to be received by a connector;

a plurality of memory chips on at least one of the first and second faces of the PCB; and two rows of conductive contacts on each of the first and second faces of the PCB, the two rows including a first row of conductive contacts proximate to the first edge of the PCB to be received by the connector, and a second row of conductive contacts between the first row and a second edge of the PCB opposite to the first edge, wherein the first and second rows of conductive contacts on the first face of the PCB are to couple only with a first memory channel, and the first and second rows of conductive contacts on the second face of the PCB are to couple only with a second memory channel.

16. The system of claim 15, wherein:

the second row of conductive contacts is between the first row and the plurality of memory chips.

17. The system of claim 15, wherein:

the first row of conductive contacts is to couple with a plurality of inner pins of the connector; and the second row of conductive contacts is to couple with a plurality of outer pins of the connector.

18. The system of claim 15, further comprising:

a motherboard including the connector.

19. The system of claim 15, further comprising:

one or more of: a display, a battery, and a power supply.

* * * * *